(12) United States Patent
Åkesson

(10) Patent No.: US 9,203,361 B2  
(45) Date of Patent: Dec. 1, 2015

(54) HARMONIC CONTROL APPARATUS AND RELATED RADIO FREQUENCY DEVICES AND BASE STATIONS

(75) Inventor: Daniel Åkesson, Hässelby (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 741 days.

(21) Appl. No.: 13/320,809

(22) PCT Filed: May 18, 2009

(86) PCT No.: PCT/SE2009/050559  
§ 371 (c)(1),  
(2), (4) Date: Nov. 16, 2011

(87) PCT Pub. No.: WO2010/134858  
PCT Pub. Date: Nov. 25, 2010

(65) Prior Publication Data  
US 2012/0071109 A1  Mar. 22, 2012

(51) Int. Cl.  
*H03F 3/24* (2006.01)  
*H03F 3/217* (2006.01)  
*H01P 7/08* (2006.01)  
*H01P 1/203* (2006.01)

(52) U.S. Cl.  
CPC ............ *H03F 3/245* (2013.01); *H01P 1/20381* (2013.01); *H01P 7/082* (2013.01); *H03F 3/217* (2013.01)

(58) Field of Classification Search  
CPC ....... H01P 1/20381; H01P 7/082; H04B 1/44; H03F 3/245; H03F 3/217  
USPC .......................................................... 455/73  
See application file for complete search history.

(56) References Cited

U.S. PATENT DOCUMENTS

| | | | |
|---|---|---|---|
| 2006/0152300 A1 | 7/2006 | Inoue et al. | |
| 2007/0262834 A1* | 11/2007 | Albacete et al. | ............... 333/204 |
| 2008/0191801 A1 | 8/2008 | Kim et al. | |
| 2009/0039962 A1 | 2/2009 | Uno et al. | |
| 2009/0075608 A1* | 3/2009 | Ichitsubo | ................... 455/127.2 |

FOREIGN PATENT DOCUMENTS

WO  WO 2009/060264 A1  5/2009

OTHER PUBLICATIONS

Burokur et al., "Influence of split ring resonators on the properties of propagating structures," IET Microw. Antennas Propag. 2007, 1, (1), pp. 94-99.  
International Search Report, PCT/SE2009/050559, Feb. 9, 2010.  
Written Opinion, PCT/SE2009/050559, Feb. 11, 2010.  
International Preliminary Report on Patentability, PCT/SE2009/050559, Issued Nov. 22, 2011, 7 pages.

* cited by examiner

*Primary Examiner* — Lewis West  
(74) *Attorney, Agent, or Firm* — Patent Portfolio Builders, PLLC

(57) ABSTRACT

Harmonic control apparatus of radio frequency (RF) devices are provided including an active device. In particular, the harmonic control apparatus includes a complementary open-loop resonator that is integrated in a conducting pattern of the harmonic control apparatus, to produce a shunt resonator that is configured to act as a short-circuit termination on at least one tuned frequency.

12 Claims, 14 Drawing Sheets

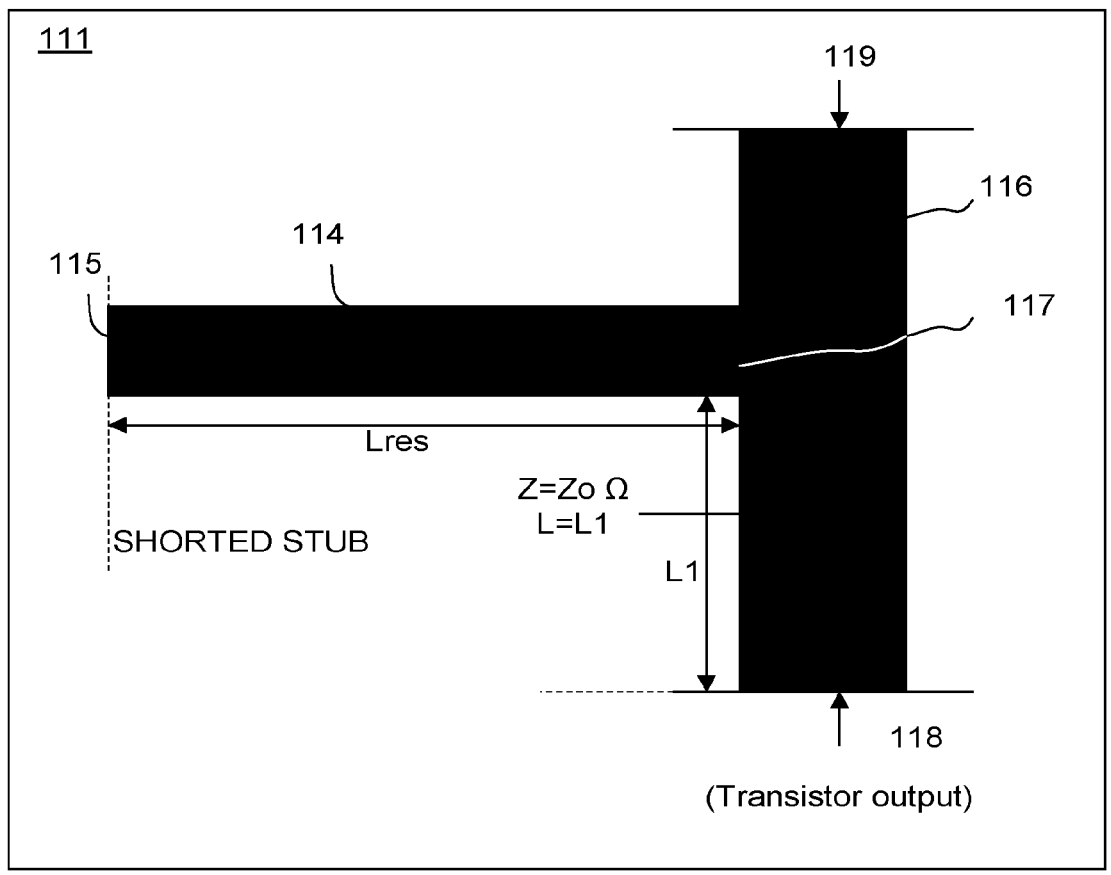
FIGURE 1A (PRIOR-ART HCC)

US 9,203,361 B2

HARMONIC CONTROL APPARATUS AND RELATED RADIO FREQUENCY DEVICES AND BASE STATIONS

CROSS-REFERENCE TO RELATED APPLICATION

This application is a 35 U.S.C. §371 national stage application of PCT International Application No. PCT/SE2009/050559, filed on May 18, 2009, the disclosure and content of which is incorporated by reference herein as if set forth in its entirety. The above-referenced PCT International Application was published in the English language as International Publication No. WO 2010/134858 on Nov. 24, 2010.

TECHNICAL FIELD

The present invention relates generally to the field of electronic components, and, more particularly to a harmonic control apparatus of a radio frequency device; it further relates to a radio frequency device and a radio base station of a telecommunications system, comprising the radio frequency device(s).

BACKGROUND

In general, efficiency is considered to be one of the most important figures of merit for a radio frequency (RF) device such as a power amplifier. An efficient power amplifier requires efficient conversion from a supplied direct current (DC) power into a transmitted RF power in order to maximize battery lifetime of e.g. a mobile terminal or to minimize power consumption and thus operating expenditures (OPEX) and heat generation of a radio base station.

In addition, switching mode power amplifiers such as class-E, class-F and inverse class-F power amplifiers operate efficiently by minimizing the overlapping transition region between consecutive voltage and current pulses. It is well known that with harmonic load impedances terminating properly, the voltage and current harmonic components of the RF output signal can be controlled and thus voltage and current pulse-shaping is achieved.

For example, an ideal class-F amplifier requires a low impedance (ideally a short-circuit termination) relative the impedance at a fundamental frequency, denoted here $f_0$, for all even harmonics and a high impedance (ideally an open-circuit termination) relative the impedance at $f_0$ for all odd harmonics to be presented, in order to suppress even harmonic voltage components and odd harmonic current components, so that consecutive non-overlapping square-wave voltage pulses and half sinusoidal current pulses are achieved. By a harmonic component is meant a multiple (odd or even) of the fundamental frequency $f_0$.

In practical applications, the class-F amplifier is thus provided with a harmonic control circuit (HCC) on the output port of the amplifier which is approximately short-circuited for at least the first even harmonic, $2f_0$ and approximately open-circuited for at least the first odd harmonic, $3f_0$.

Harmonic control circuits can for example be implemented on a separate printed circuit board (PCB) provided outside an active device package or an active device bare-die. Another way of HCC implementation is on-chip, either with bond-wires connecting capacitors (e.g. metal insulator metal (MIM) capacitors) or integrated passive devices (IPD) or monolithically integrated on monolithic microwave integrated circuits (MMICs). The passives can be either on the same semiconductor substrate as the active device or on a separate substrate.

In U.S. patent No. 2007/0057731 A1 there is disclosed a HCC for a RF power amplifier comprising an on-chip transistor formed on a semiconductor substrate and an on-chip harmonic termination formed on the same substrate. In this prior art, two resonator cells are provided wherein on-chip harmonic termination is configured to provide a short-circuit termination for even-harmonics of the RF output signal and to provide an open-circuit termination for odd harmonics of the RF output signal. The HCC is here implemented with bond-wires and MIM capacitors, and is provided in cascade with an output matching network.

HCCs with more than one resonator cell can also be used to control subparts of the same frequency band in order to increase bandwidth. This is disclosed in U.S. Pat. No. 7,176,769 B1.

It is further known that a transmission line of a predetermined physical length being terminated with either a short-circuit or with an open-circuit in one end, provides an alternating short-circuit termination or an open-circuit termination in the other end with a periodicity of twice the frequency at which the electrical length of the transmission line corresponds to a quarter of a wavelength. It is also known that if such a terminated transmission line is connected in shunt to a mainline, a so called quarter-wave stub is realized, providing an alternating short-circuit to the mainline junction point or being invisible to the main-line with the same periodicity. Furthermore, if the junction point of such a quarter-wave stub is offset an arbitrary electrical length from a first mainline terminal, any reflection angle between an open-circuit (i.e. reflection angle 0°) and a short-circuit (i.e. reflection angle 180°) can be obtained.

Consequently, by shunting a mainline with one or more stubs of equal or of different lengths at predetermined offset positions relative a first mainline terminal, a single harmonic or a multiple order HCC is achieved. One example of an HCC implemented in accordance with the above described prior art is described in US patent document No. 2008/0191801. In this prior art, the HCC is implemented with microstrip on PCB and is provided in cascade with an output matching network.

A drawback with the HCC disclosed in this prior art, is the large board area being occupied by the required lengths of series and shunt transmission lines. Another drawback relates to the cost, loss and tolerance when using short-circuited stubs since the use of short-circuited stubs generally require means for DC-blocking. As an example, in order not to short-circuit the DC-supply of the active device, typically a DC-blocking capacitor is required.

Another disadvantage is the inherent periodicity of the quarter-wave stubs, which makes it hard to independently control multiple harmonics. Yet another disadvantage is the undesired reactive component at other frequencies than the controlled harmonic(s). As an example a $3f_0$ quarter wave stub does not provide a high enough fundamental impedance in order to being invisible at $f_0$. Consequently it is hard to independently control multiple harmonics and fundamental matching in a matching network incorporating such a prior-art HCC.

For large power devices, which usually include a number of small amplifier cells on a common or on separate dies, the cells are paralleled to a common relatively wide output lead by a corporate feed network. Increasing the number of paralleled device outputs lower the required fundamental impedance for optimum efficiency and output power. Wide low impedance output lines on PCB are therefore typically required both to accommodate the wide device leads and to match to the relatively low optimum fundamental impedance.

It should be noted that it is known that a shunt stub having a significantly higher impedance than the mainline shunted becomes more narrow-band compared to a lower impedance stub i.e. the frequency range over which essentially a short-circuit termination is presented is reduced. It is also well known that such a relatively high impedance stub provides a less effective short-circuit termination at the resonant frequency i.e. the desired zero ohms short-circuit termination is approximated with a higher impedance.

Another consequence of the relatively wide low impedance output line required for high power devices is that the corporate feed network together with the output matching network form a distributed combiner network and for a high power device the harmonic termination presented to each cell can vary due to varying electrical length to the harmonic short-circuit termination, with reduced efficiency as a result. Consequently a prior art HCC is hard to combine with a low impedance fundamental matching network required for large high power devices.

It should be noted that another class of prior art HCCs on PCB not incorporating quarter-wave stubs are known as electromagnetic band-gap (EBG) structures, and defected ground structures (DGS). EBGs are relatively large periodic structures typically utilized for harmonic suppression i.e. filtering. Due to the distributed nature of EBGs these are not suitable for controlled termination angles. DGS on the other hand are smaller than EBG but require etched ground plane patterns, which are not suitable for implementation with microstrip in multi-layer boards and are also less compatible with mounting on PCB to metal heatsinks.

SUMMARY

It is therefore an object of the exemplary embodiments of the present invention to provide a harmonic control apparatus or circuit of an RF device, e.g. power amplifier and/or a mixer, that is easily integrated within a substrate of the RF device in order to realize efficient harmonic control that overcomes at least some of the drawbacks associated with prior art substrate-based implementations.

According to an aspect of exemplary embodiments of the present invention, there is provided a harmonic control apparatus of a RF device (e.g. power amplifier or a mixer) comprising an active device (e.g. a transistor or a mixer) including one or more input terminals and one output terminal. The harmonic control apparatus comprising a conducting pattern provided in a first conducting layer, being disposed on a first side of a planar dielectric substrate, facing a second conducting layer on the opposite side of the dielectric substrate, said second conducting layer acting as a ground plane. According to the present invention, the harmonic control apparatus further comprises a complementary open-loop resonator integrated in the conducting pattern to produce a shunt resonator acting as a short-circuit termination on at least one tuned frequency.

According to an exemplary embodiment of the present invention, the conducting pattern with the integrated complementary open-loop resonator is part of a matching network of the RF device.

According to another exemplary embodiment of the present invention the harmonic control apparatus comprises more than one different complementary open-loop resonator integrated in series in the conducting pattern, in order to realize multiple harmonics control, wide-band harmonic control or a combination of both.

According to yet another exemplary embodiment of the present invention, the harmonic control apparatus comprises more than one identical complementary open-loop resonator integrated in parallel in the conducting pattern. The harmonic control apparatus in accordance with this exemplary embodiment of the present invention minimizes the matching asymmetry associated with larger die sizes and is also scalable with the RF device size.

According to another aspect of the present invention, there is provided a radio base station of a telecommunications system incorporating the RF device provided with the harmonic control apparatus in accordance with the present invention.

An advantage with the present invention is that the harmonic control apparatus provides high flexibility of integration within a high power matching network.

Another advantage with the present invention is that due to the compact size of the HCC apparatus it is compatible with a wide range of substrate based technologies.

A further advantage with the present invention is that the HCC apparatus provides a robust short-circuit termination at RF without the need for a DC-blocking capacitor and its associated drawbacks.

Still other objects and features of the exemplary embodiments of the present invention will become apparent from the following detailed description in conjunction with the accompanying drawings, attention to be called to the fact, however, that the following drawings are illustrative only, and that various modifications and changes may be made in the specific embodiments illustrated. It should further be understood that the drawings are not necessarily drawn to scale.

BRIEF DESCRIPTION OF THE DRAWINGS

FIG. 1A illustrates a diagram of a HCC apparatus in accordance with prior-art;

DETAILED DESCRIPTION

Figure 1B:
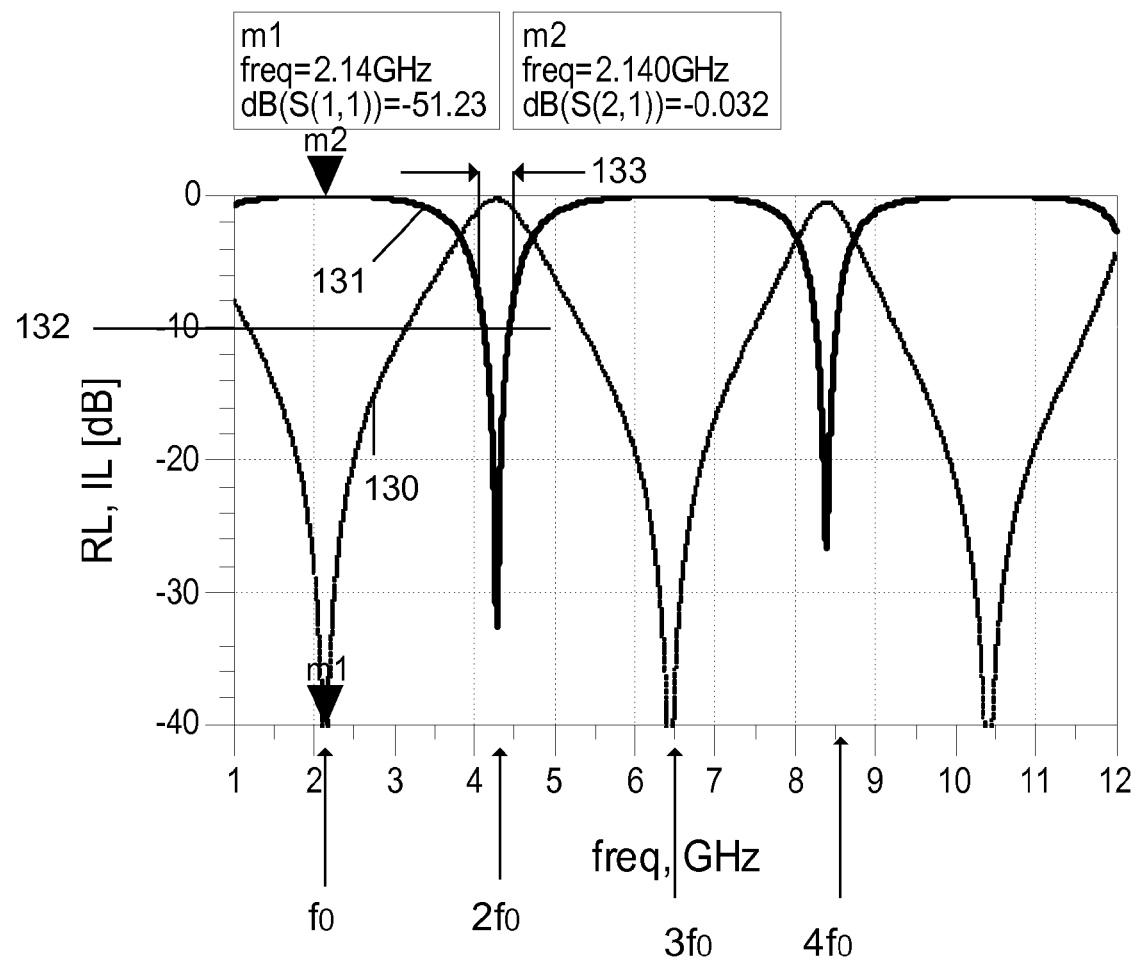
FIG. 1B is a dB-plot of the simulated reflection and transmission of the prior art HCC apparatus of FIG. 1A.

In the following description, for purposes of explanation and not limitation, specific details are set forth such as particular apparatuses, architectures, techniques, etc. in order to provide thorough understanding of the present invention. However, the different exemplary embodiment of the present invention may be practiced in other embodiments that depart from these specific details.

The different embodiments of the present invention are described herein by way of reference to particular example circuits/apparatuses. In particular, the invention is described in a non-limiting general context in relation to a harmonic control apparatus of an RF device for a radio base station of any suitable telecommunications system such as the third generation UMTS system, the long term evolution (LTE) concept, the LTE-advanced system, the GSM system etc.

With reference to FIG. 1A there is depicted a diagram of a prior art HCC apparatus 111. As shown, a first transmission line 114 with characteristic impedance $Z_1$ is terminated in one end with a short-circuit termination 115. It should be mentioned that the short-circuit termination may also be provided with means for DC-blocking (not shown). The physical length, denoted Lres, of the terminated transmission line 114 is chosen to correspond to an electrical length of a quarter of a wavelength (i.e. 90°) at a fundamental frequency $f_0$. The other end of the transmission line 114 is connected in shunt to a mainline 116 with characteristic impedance $Z_0$ at a junction point 117, being offset a physical length L1 from an input port 118 of the mainline 116. The input port 118 corresponds to the input port or output port of an active device such as a transistor as indicated in FIG. 1A. The other end of the mainline 116 is terminated in an output port 119. This way an offset short-circuited quarter-wave stub is formed (shorted stub). Both ports are assumed to be terminated with the same characteristic impedance $Z_0$.

Referring to FIG. 1B, the simulated reflection (i.e. return loss (R.L)) in dB-scale of input port 118 versus frequency is represented with a thin line 130. Simulated transmission (i.e. insertion loss (I.L)) in dB-scale between input port 118 (of FIG. 1A) and output port 119 (of FIG. 1A) versus frequency is also shown. The simulated transmission is represented with a bold line 131. In this example, the fundamental frequency $f_0$ is considered to be equal to freq=2.140 GHz. It should be noted that any suitable value of $f_0$ can be used. At $f_0$ the short-circuit termination 115 is transformed to an open-circuit termination in junction point 117. The transmission line 114 is therefore invisible to the mainline 116.

At this frequency $f_0$, the prior art HCC apparatus 111 presents an almost perfect match to the port impedance $Z_0$, as can be seen in FIG. 1B, (50 dB R.L (m1)) and consequently nearly lossless transmission (0 dB I.L (m2)).

However, at the second harmonic i.e. at $2f_0$=4.280 GHz, the stub presents a short-circuit termination to the junction point 117. Thus the prior art HCC apparatus 111 presents almost total reflection (0 dB R.L) to the input port 118 and consequently nearly perfect suppression (more than 30 dB I.L). For frequencies approximating $2f_0$ the stub presents a low impedance approximating a short-circuit termination, and for an arbitrary chosen suppression level 132 (e.g. 10 dB), there exists a corresponding frequency range 133 over which at least this suppression is maintained. A normalized suppression bandwidth can be defined as the ratio between the frequency range 133 and the center frequency where maximum suppression is obtained. For a suppression level of 10 dB the example in FIG. 1B corresponds to 7.5% suppression bandwidth.

It can also be seen in FIG. 1B that the prior art HCC apparatus 111 provides an alternating short-circuit- or an open-circuit termination with a periodicity of $2f_0$ (thus $3f_0$ being passed, $4f_0$ being blocked etc.) If the offset length L1, in FIG. 1A, is chosen to correspond to a quarter of a wavelength at $2f_0$, (i.e. 45° at $f_0$) the short-circuit termination at the junction point 117 is transformed to an open-circuit termination at the input port 118.

Figure 1C:
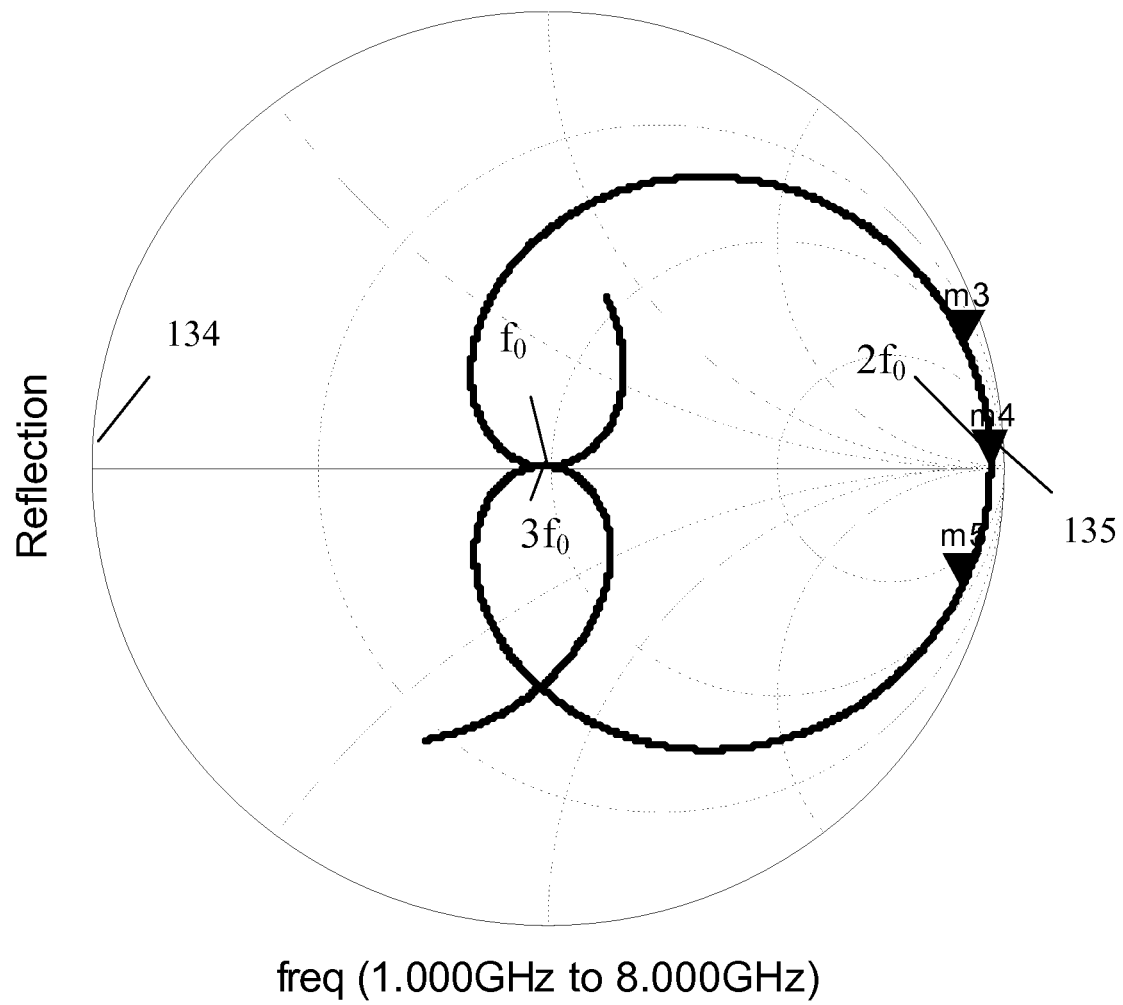
FIG. 1C is a Smith chart of the simulated reflection of the prior art HCC apparatus of FIG. 1A.

In FIG. 1C the resulting simulated complex reflection trace of this situation is presented in polar form in a Smith chart, the far left of the chart representing a short-circuit termination 134 and the far right representing an open-circuit termination 135. As can bee seen, a nearly perfect open-circuit termination is presented at $2f_0$ (m4). Thus the HCC apparatus 111 is realizing a second-harmonic open-circuit termination. It can also bee seen that a perfect match to $Z_0$ (corresponding to the origin of the Smith chart) occurs both at $f_0$ and at $3f_0$.

Now assuming the HCC apparatus 111 had been tuned for $3f_0$ instead, a corresponding perfect match would fall at 1.5× $f_0$. Such a prior art HCC apparatus would therefore clearly affect both $f_0$ and $2f_0$ with a R.L in the order of 10 dB.

Figure 2:
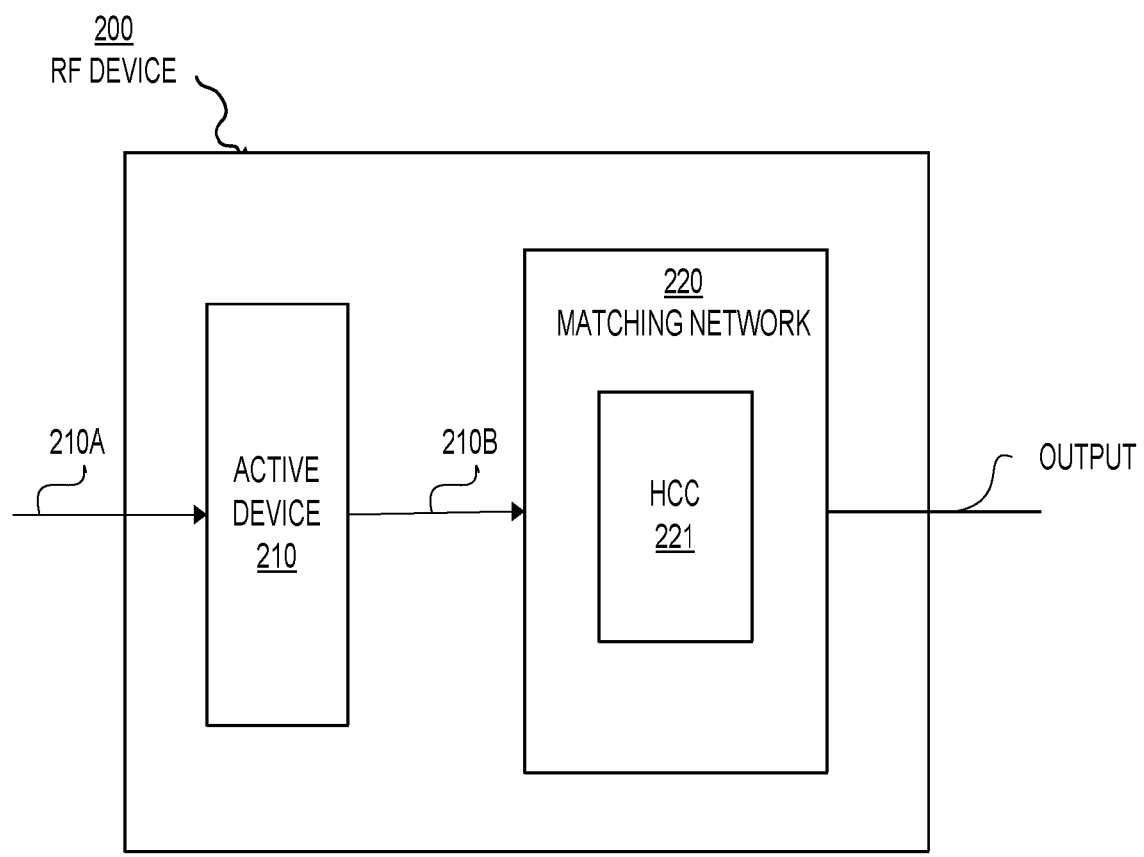
FIG. 2 is a block diagram illustrating a radio frequency device incorporating a harmonic control apparatus (HCC) in accordance with an exemplary embodiment of the present invention.

Referring to FIG. 2, there is illustrated a general structure of an exemplary RF device 200 in accordance with an exemplary embodiment of the present invention. The RF device 200 comprises an active device 210 which output terminal 210B is connected to a harmonic control apparatus 221, denoted here HCC which is here shown part of a matching network 220. The active device 210 is here shown with a single input terminal 210A. It should be noted that the active device 210 may also comprise additional input terminals. The HCC 221 being connected to the active device 210, is configured to receive the output signal 210B generated by the active device 210 and further configured to control at least one harmonic of a frequency band of operation of the active device 210, by providing a short-circuit termination on at least one tuned frequency.

Figure 3A:
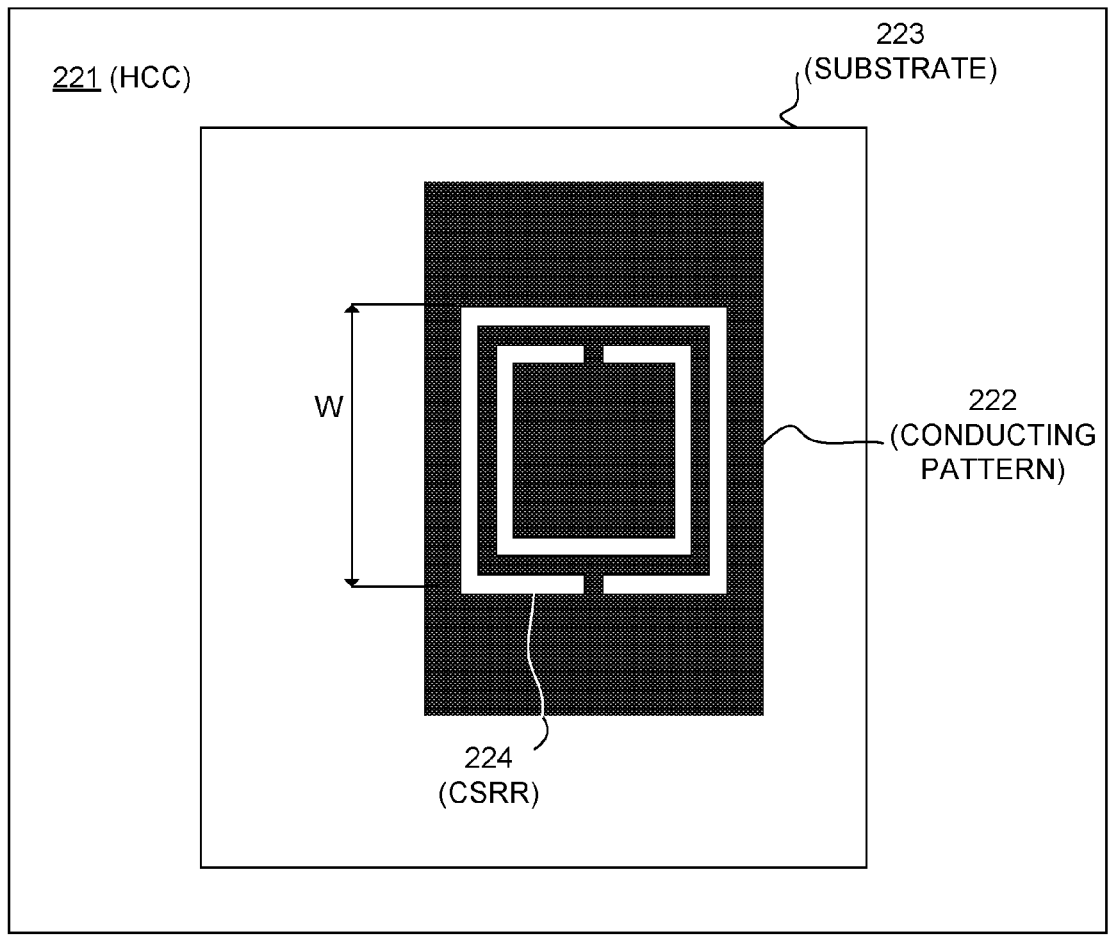
FIG. 3A is a simplified diagram of a HCC apparatus according to an exemplary embodiment of the present invention.

According to an exemplary embodiment of the present invention, and with reference to FIG. 3A, the HCC apparatus 221 comprises a conducting pattern 222 (e.g. a transmission line) which is provided in a first conducting layer (not shown) disposed on a first side of a planar dielectric substrate 223, facing a second conducting layer (not shown) on the opposite side of the dielectric substrate. The second conducting layer acts as a ground plane relative to the first conducting layer. As an example, the HCC apparatus 221 can be viewed as comprising a conducting pattern is the first conducting layer, disposed on a top side of the planar dielectric substrate, a bottom side of the first conducting layer facing a second conducting layer that acts as a ground plane on the opposite side of the planar dielectric substrate. The conducting pattern can be formed on a PCB or on a semiconductor substrate on which the active device is integrated or on a semiconductor substrate that is different from the semiconductor substrate on which the active device is integrated.

Referring back to FIG. 3A, the HCC apparatus 221 is shown comprising a complementary open-loop resonator which is integrated as one (or more) non-conducting slot(s) in the conducting pattern 222. The resonator can be provided on at least one series transmission line of the conducting pattern 222 or on at least one shunt stub of the conducting pattern 222. In FIG. 3A, the complementary open-loop resonator is represented by a complementary split-ring resonator (CSRR) 224 which is configured to produce a shunt resonator that acts as a short-circuit termination on at least one tuned frequency. The resonant frequency of the CSRR 224 can be tuned by varying the physical dimensions of the CSRR 224. The CSRR 224 is shown here composed of two concentric rings. W represents the width of the CSRR resonator 224. It should be noted that in order to control a reflection phase of the harmonic short-circuit termination, the CSRR 224 can be configured to be offset a predetermined electrical length from the input terminal(s) or the output terminal of the active device it is connected to.

Figure 3B:
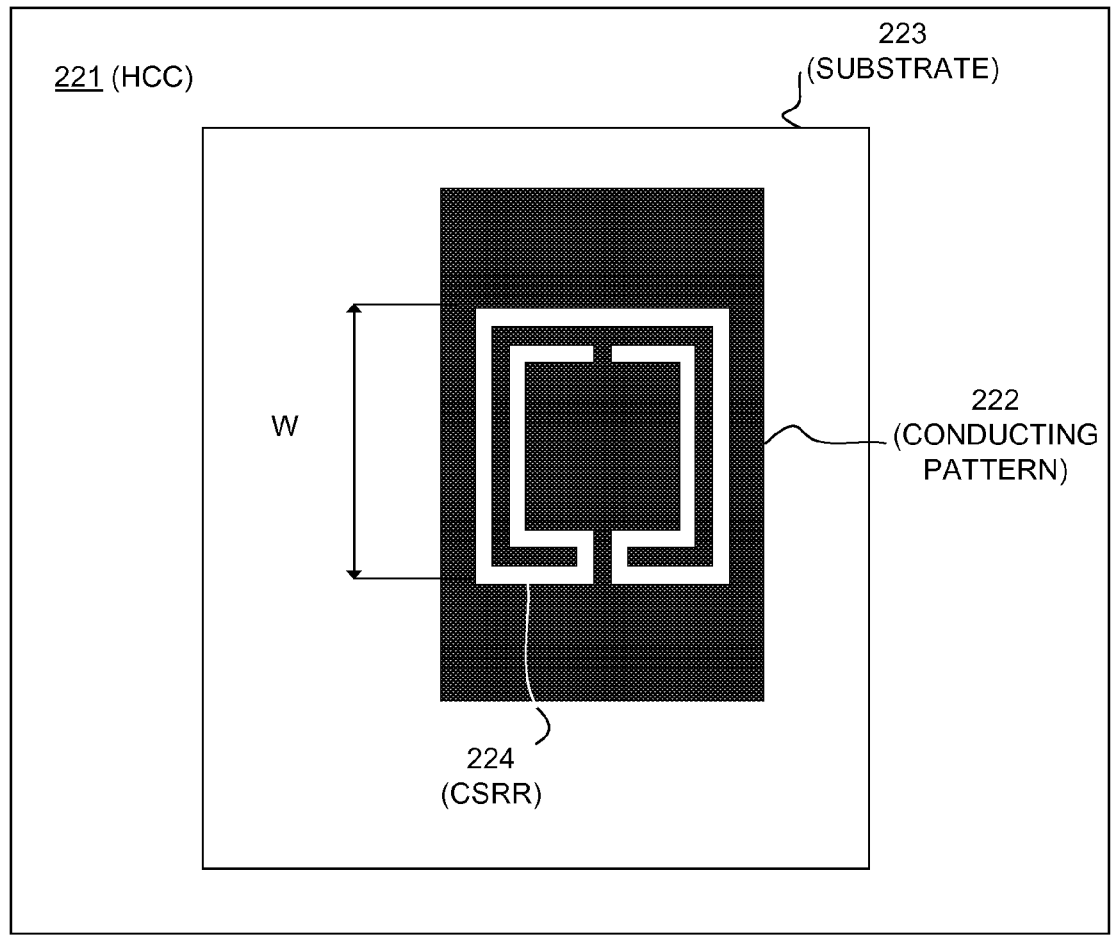
FIG. 3B is a simplified diagram of a HCC apparatus according to another exemplary embodiment of the present invention.
Figure 3C:
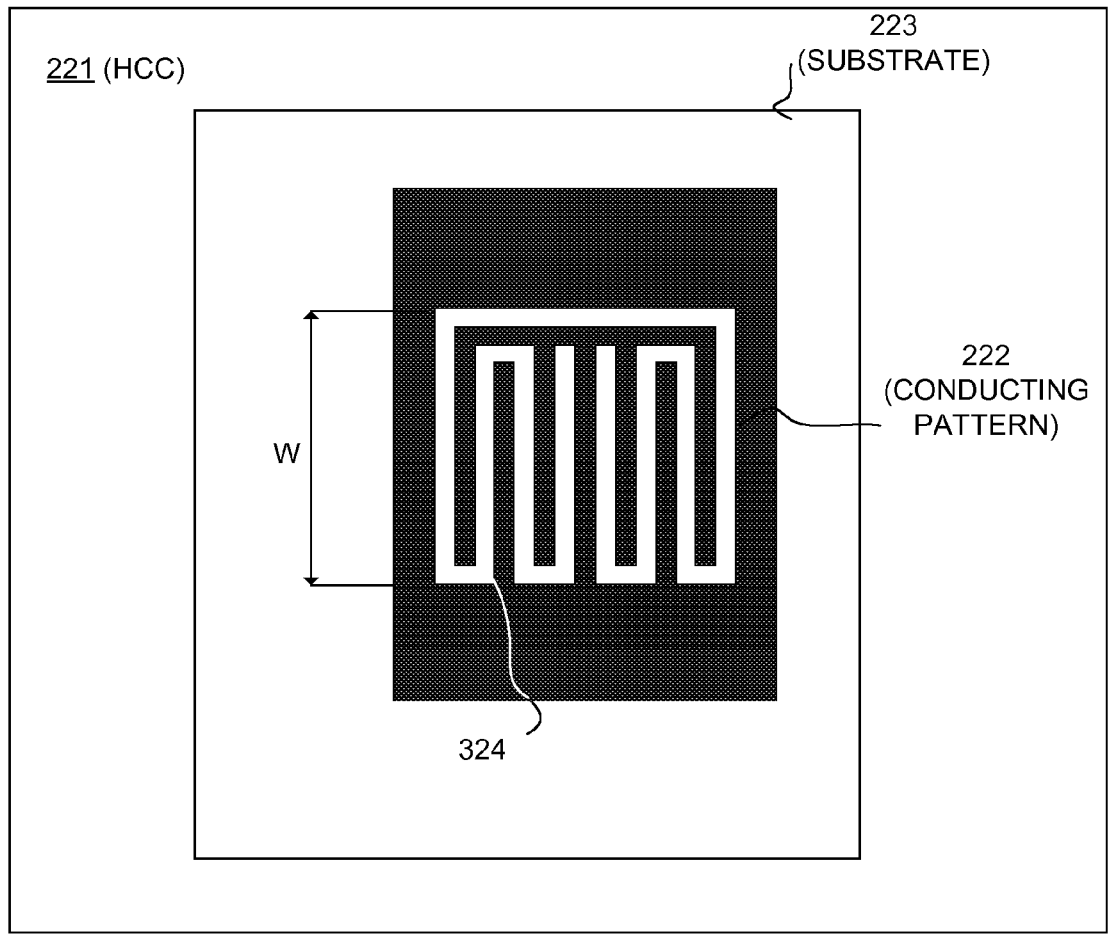
FIG. 3C is a simplified diagram of a HCC apparatus according to yet another exemplary embodiment of the present invention.

In FIG. 3B, the concentric rings of the CSRR 224 are shown connected to each other. By connecting the two rings, a smaller resonator is achieved for the same tuned frequency. The CSRR resonator 224 of FIG. 3B is approximately 20% smaller than the resonator of FIG. 3A. A further variation of the complementary open-loop resonator is depicted in FIG. 3C and indicated with reference number 324. By occupying a larger part of the resonator area with a resonating structure an even smaller resonator is achieved for the same tuned frequency, this implementation however only having approximately half the suppression bandwidth of the corresponding resonator in FIG. 3A. The resonator of FIG. 3C can e.g. be 36% smaller than the resonator of FIG. 3A. The exemplary embodiments of the present invention are therefore not restricted to any particular shape of the complementary open-loop resonator.

Figure 4A:
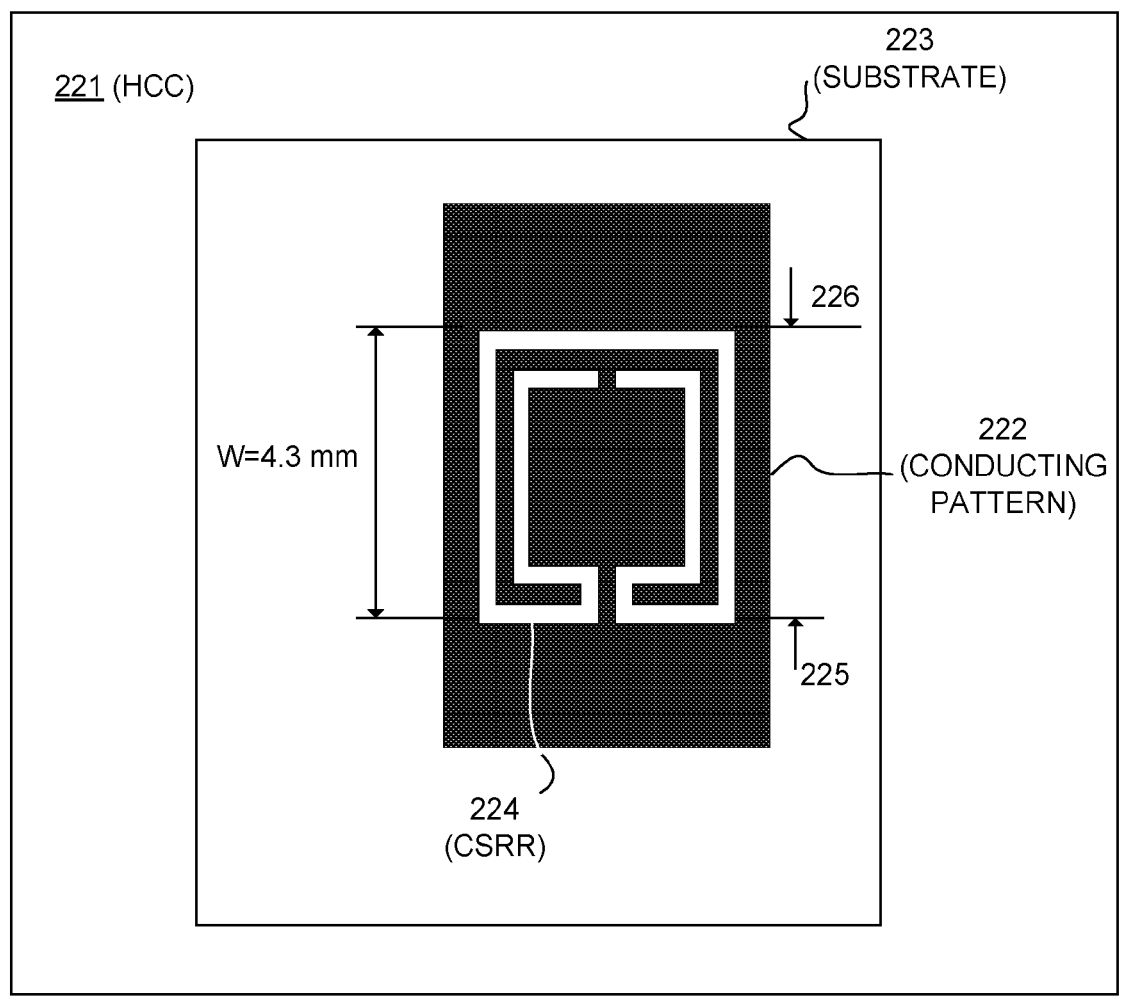
FIG. 4A illustrates the HCC apparatus from FIG. 3B in accordance with an exemplary embodiment of the present invention.

Referring to FIG. 4A, there is illustrated a HCC apparatus 221 of a RF device, in accordance with an exemplary embodiment of the present invention. In this example, the fundamental frequency $f_0$ is also here considered to be equal to 2.140 GHz, although any suitable value of the fundamental frequency can be used. The HCC apparatus 221 corresponds to HCC 221 of FIG. 3B. It is further considered that the CSRR 224 is provided in a conducting pattern corresponding to a microstrip transmission line having a width of 5.4 mm. The substrate used has a thickness equal to 0.8 mm and the dielectric constant of the substrate $\in$ is equal to 3.5. It should be noted that if the integrated CSRR 224 is implemented on a thinner substrate with a higher dielectric constant, an even smaller resonator for the same tuned frequency can be achieved.

Figure 4B:
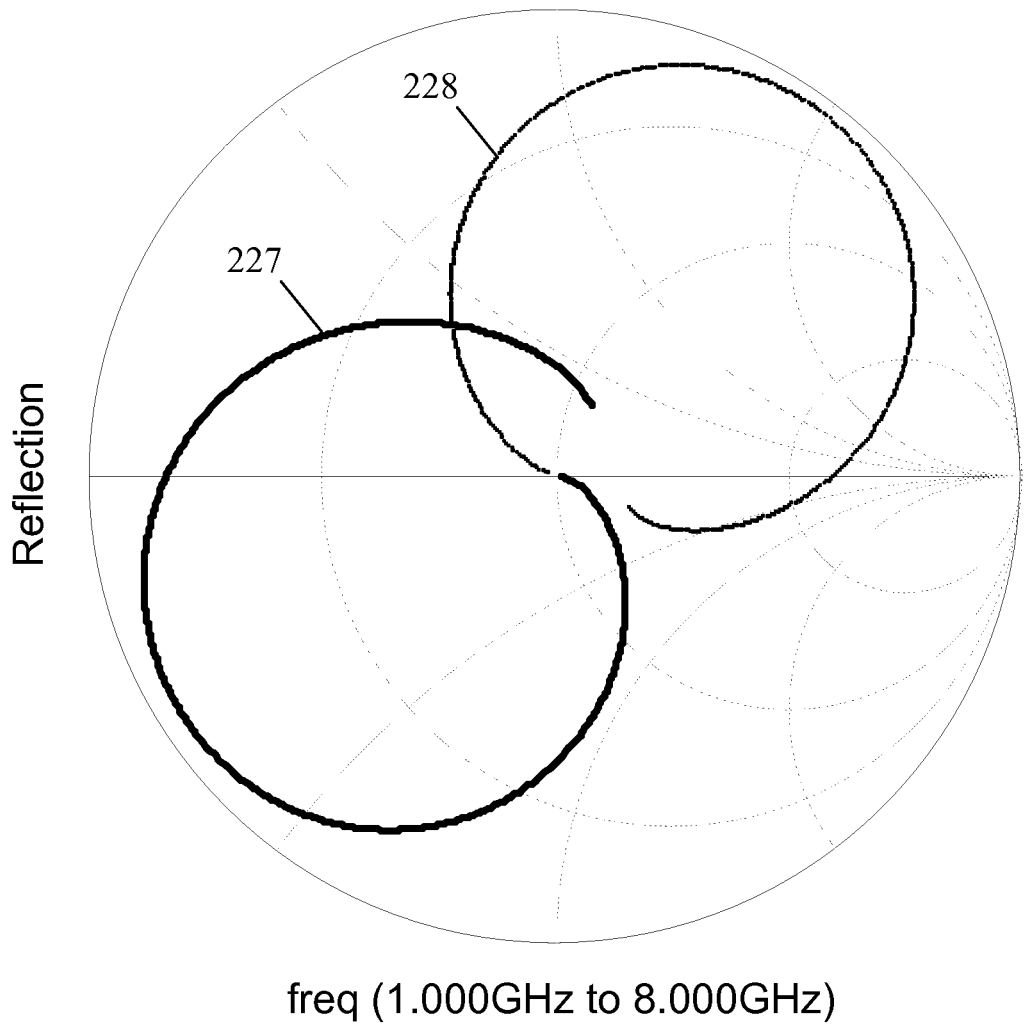
FIG. 4B is a Smith chart of the simulated reflection of the HCC apparatus of FIG. 4A.

In FIG. 4A, the transmission line is shown accommodating the CSRR 224 capable in controlling the harmonic frequency corresponding to $2f_0$. The width W of the CSRR 224 is here equal to e.g. 4.3 mm. In FIG. 4B the simulated complex reflection is presented in polar form in a Smith chart. The reflection as defined in a first port reference plane 225 (of FIG. 4A) is represented with bold line 227 and the reflection as defined in a second port reference plane 226 (of FIG. 4A) is represented with thin line 228. Clearly the first port reflection 227 represents a slightly rotated short-circuit termination, while the second port reflection represents a slightly rotated open-circuit termination.

Figure 4C:
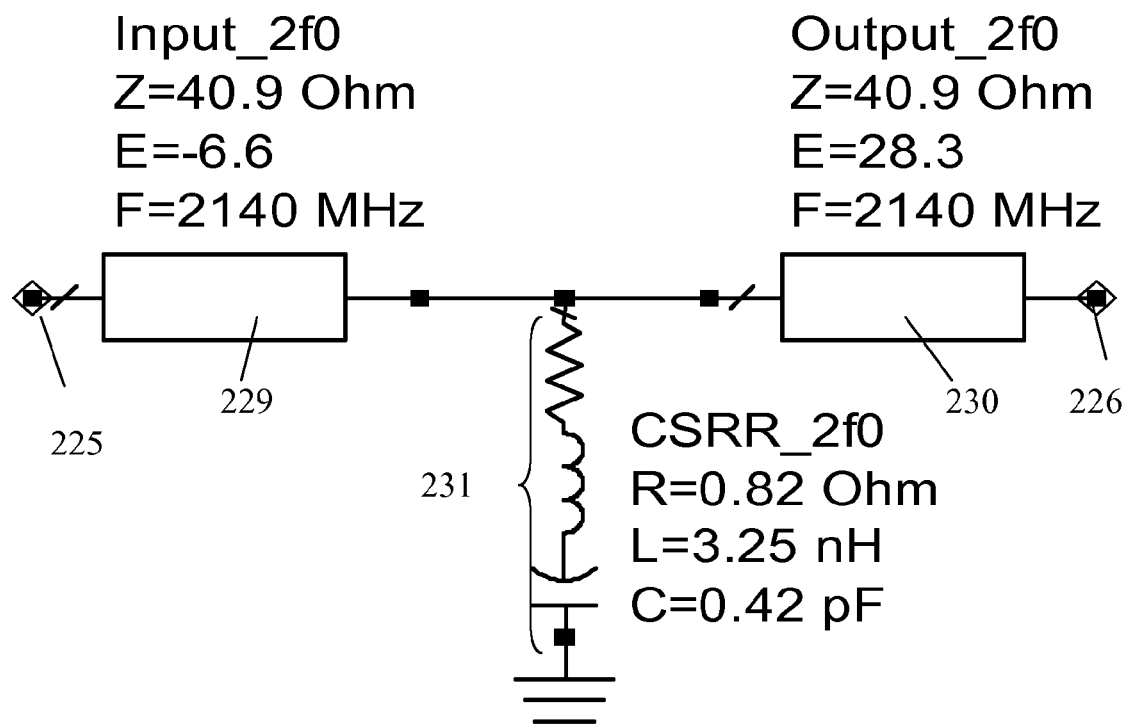
FIG. 4C illustrates the corresponding equivalent circuit for the HCC apparatus of FIG. 4A.

The equivalent circuit of the HCC apparatus with the integrated CSRR 224 of FIG. 4A is shown in FIG. 4C. As shown, the equivalent circuit of the HCC apparatus 221 comprises two series transmissions lines 229, 230 and a resistance, an inductance and a capacitance forming a shunt series RLC resonator 231 that is configured to determine one tuned harmonic frequency (e.g. $2f_0$). The values of the components of the equivalent circuit and the values of the characteristics of the circuit are also given in FIG. 4C, (Z=40.9 Ohm; F=$f_0$=2140 MHz; R=0.82 Ohm; L=3.25 nH; C=0.42 pF). It should be noted that the values depicted in FIG. 4C are only exemplary values and the present invention is not restricted to any particular value. In FIG. 4C, the reflection angles of the first port reference plane 225 and the second port reference plane 226 is modeled with the first transmission line 229 with a relatively short negative electrical length (E=−6.6) connected to the first port 225 and the second transmission line 230 with a significantly longer (positive) electrical length (E=28.3) connected to the second port 226. The negative electrical length input line rotates the short-circuit termination from the shunt series RLC counter-clockwise (227 in FIG. 4B), while the positive electrical length output rotates the short-circuit termination clockwise from the shunt series RLC towards open condition (228 in FIG. 4B).

Figure 5A:
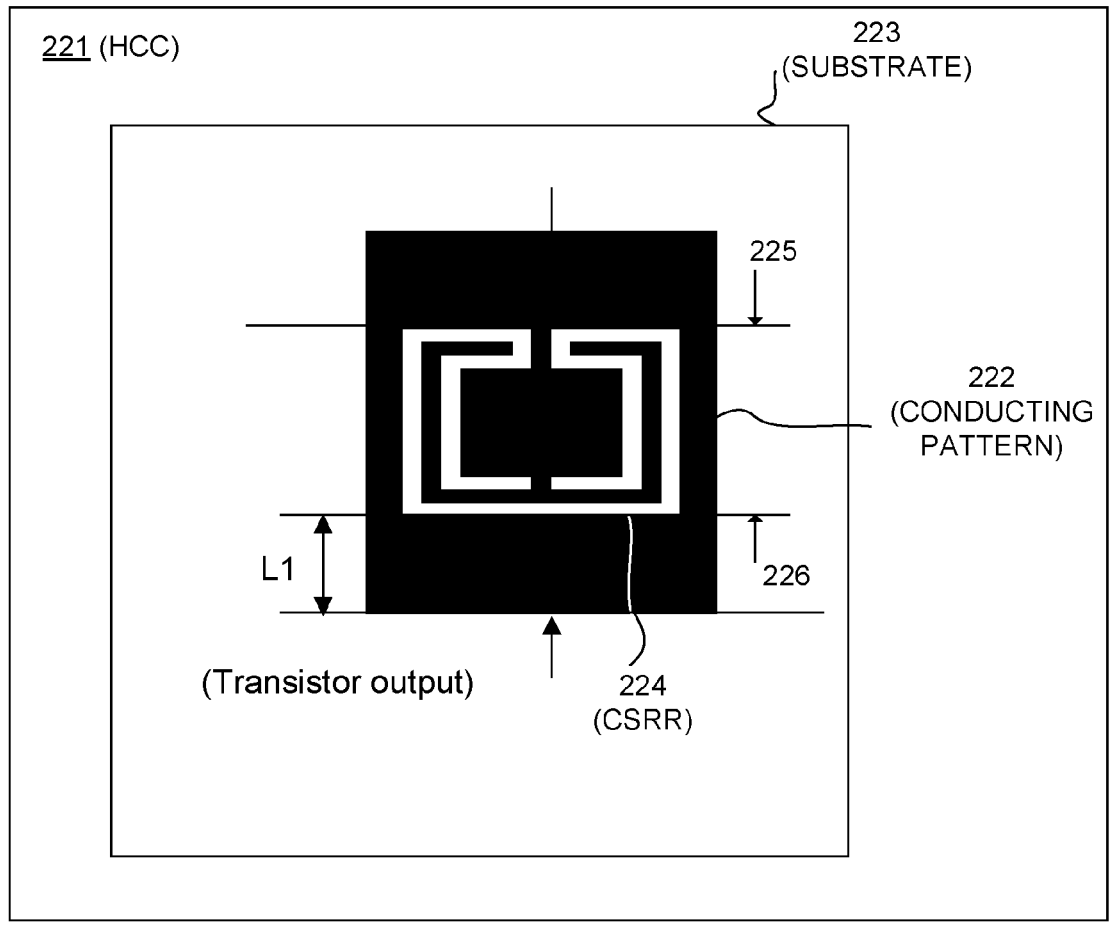
FIG. 5A illustrates a HCC apparatus according to another exemplary embodiment of the present invention.

Referring to FIG. 5A, a CSRR 224 rotated 180° as compared to that of FIG. 4A is shown in a HCC 221 in accordance with another exemplary embodiment of the present invention. This resonator 224 is configured so that the second port 226 in FIG. 4A is now facing the transistor output (corresponding to the reflection trace 228 in FIG. 4B) and in this case only a short offset length L1 (e.g. 16.7° at $f_0$) is required to transform the CSRR termination into an open-circuit termination. Likewise, in order to realize a compact short-circuit termination, the CSRR 224 is simply rotated 180°. Another exemplary embodiment would be to use a significantly longer offset transmission line connected to the same port 226, thus offering a higher degree of design flexibility as compared to prior-art.

Figure 5B:
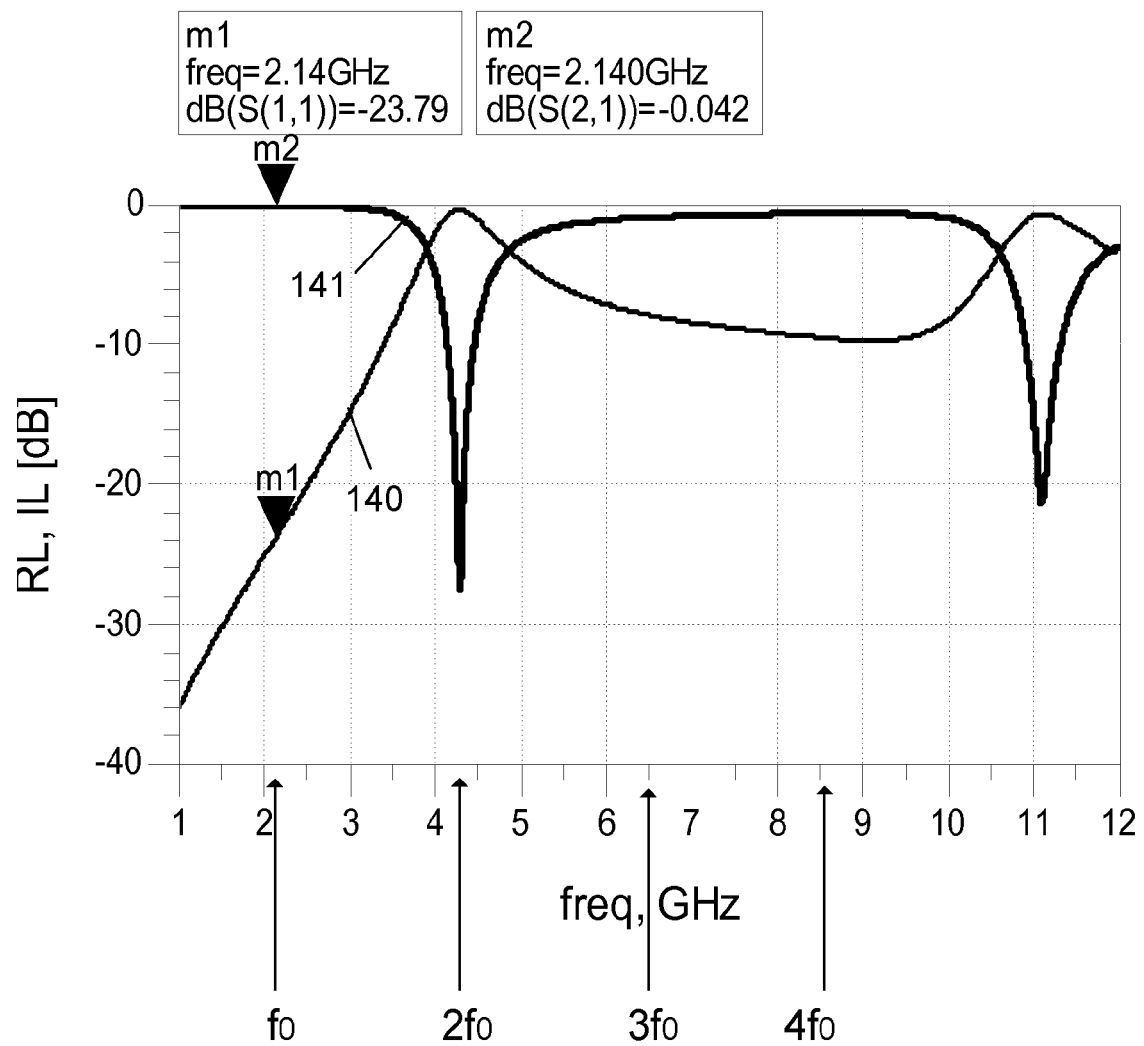
FIG. 5B is a dB-plot of the simulated reflection and transmission of the HCC apparatus of FIG. 5A.
Figure 5C:
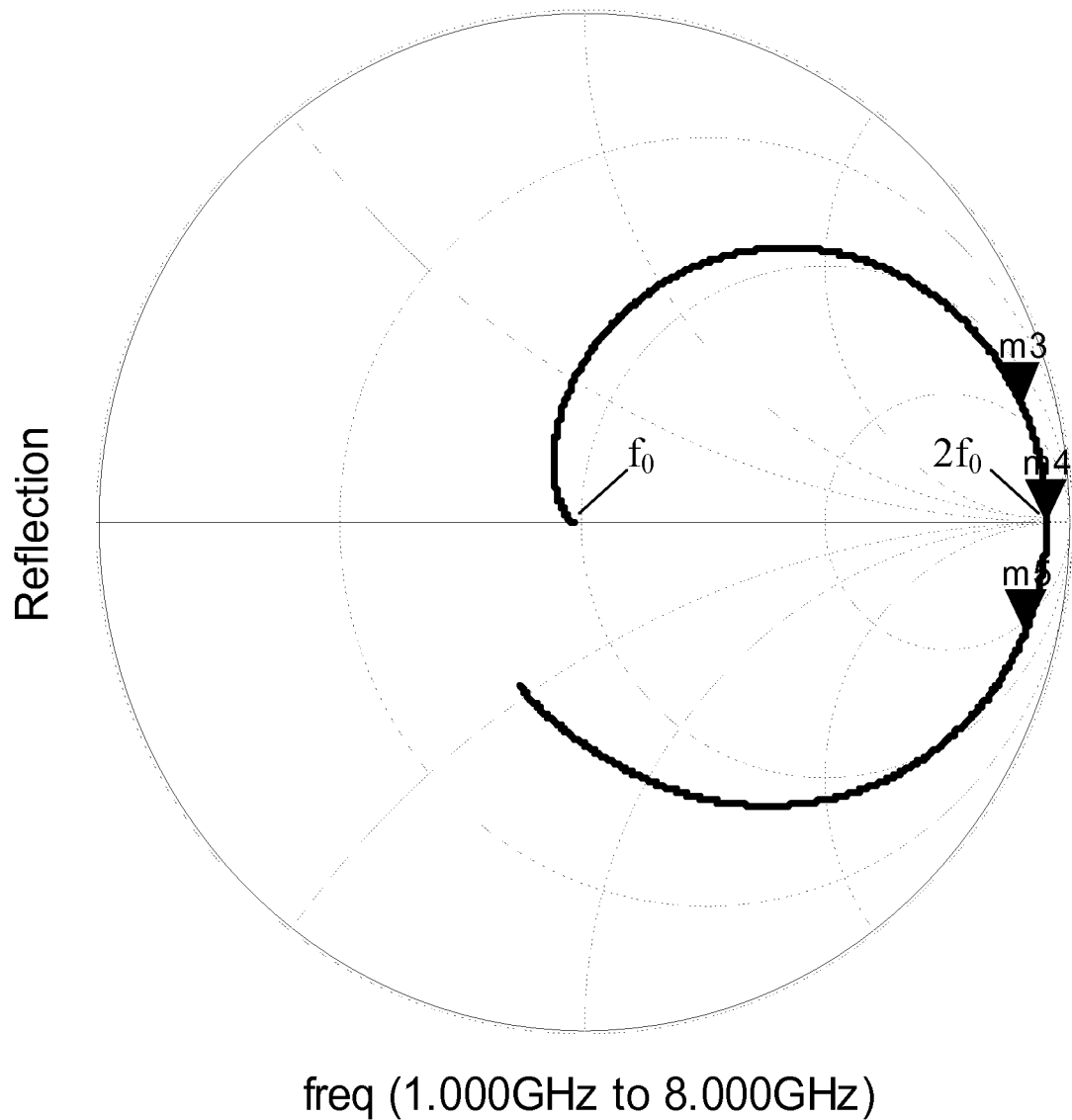
FIG. 5C is a Smith chart of the simulated reflection of the HCC apparatus of FIG. 5A

The simulated reflection and transmission in FIG. 5B demonstrates other advantages of the present invention: As shown in FIG. 5B, the simulated reflection (i.e. return loss (R.L)) in dB-scale versus frequency is represented with a thin line 140. The simulated transmission in dB-scale versus frequency is depicted in bold line 141. In this example, the fundamental frequency $f_0$ is also here considered to be equal to freq=2.140 GHz. The harmonic frequencies $2f_0$, $3f_0$ and $4f_0$ are also indicated. A significantly smaller HCC 221 with similar performance regarding suppression bandwidth and loss compared to prior-art (FIG. 1A-C), have thus been realized. Furthermore, the harmonic open-circuit termination realized has 15% less variation in reflection phase (as indicated by m3 and m4 placed at $2f_0 \pm 100$ MHz in FIGS. 1C and 5C) compared to prior-art.

Furthermore, the CSRR 224 in this exemplary embodiment has a spurious free range above the fourth harmonic $4f_0$ (the first spurious mode occurring slightly above the fifth harmonic $5f_0$). Also, the low frequency passband has a low-pass characteristic, as compared to a band-pass in prior art (FIG. 1B). The advantage of this is appreciated when considering the case where the HCC had been tuned for $3f_0$ instead: Such a HCC would have minimum impact at $f_0$ and $2f_0$.

The spurious free range in conjunction with the low-pass characteristic facilitates cascading of additional HCC stages so as to achieve independent multi-harmonic control at arbitrary frequencies. In other words, cascaded stages of complementary splint ring resonators can be provided for the HCC in accordance with the present invention, for independently controlling a plurality of harmonic frequencies.

A further advantage with the small size is the ability to utilize multiple CSRR's in parallel in a low impedance line, thereby minimizing variation in harmonic termination angle over the active die as well as providing a more effective harmonic termination at the lower impedance levels. By providing additional complementary open-loop resonators integrated in the conducting pattern, further shunt resonator(s) can be provided to act as short-circuit termination(s) on at additional tuned frequency(ies).

As described earlier, the HCC(s) in accordance with the exemplary embodiments of the present invention can be integrated in a matching network (see e.g. FIG. 2) of the RF device without degrading fundamental matching performance. As an example, when providing a HCC with one or several integrated CSRRs in a matching network of a RF device, multiple harmonics (e.g. $2f_0$ and $3f_0$) can be tuned to desired conditions without degrading fundamental matching performance. The conducting pattern of the RF device can be formed on a PCB or on a semiconductor substrate (MMIC or bare-die) on which the active device (e.g. transistor or mixer) of the RF device is integrated or on a semiconductor substrate that is different from the semiconductor substrate on which the active device is integrated.

Figure 6:
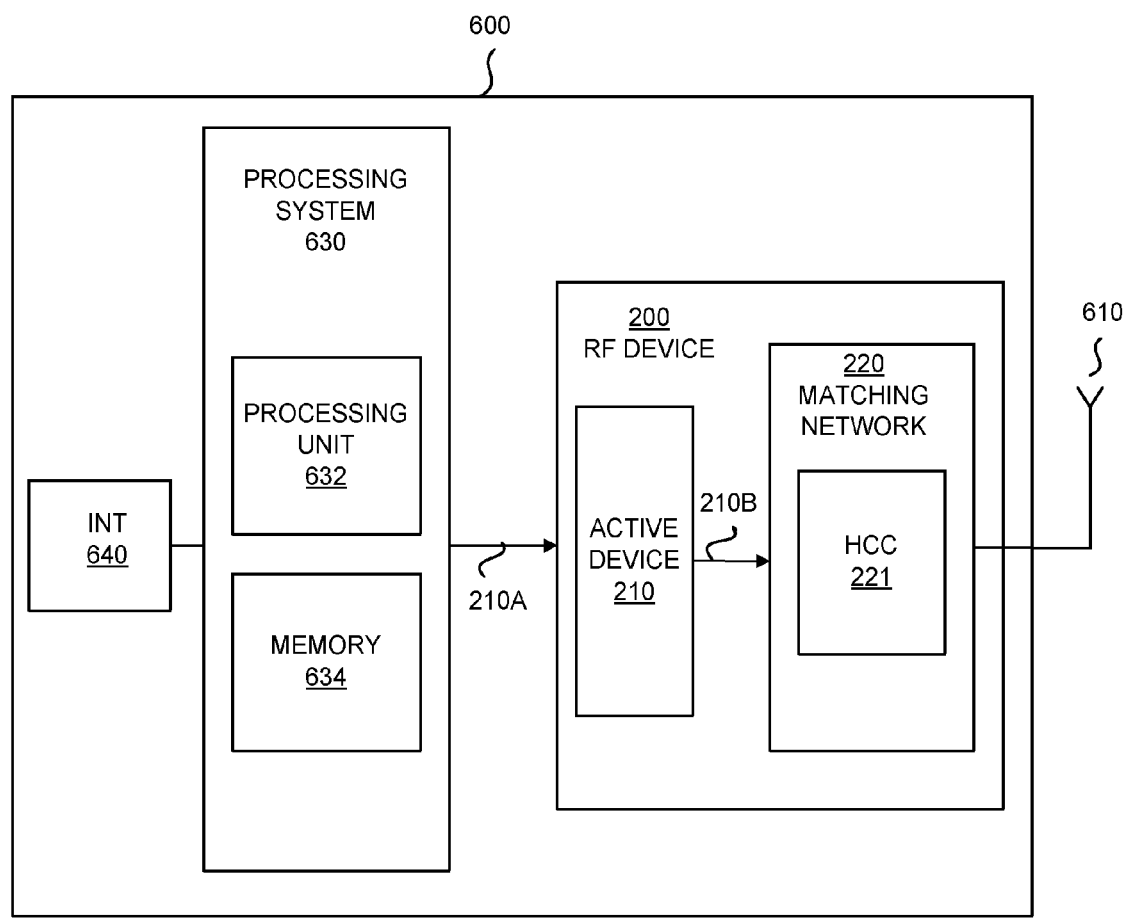
FIG. 6 illustrates an exemplary block diagram of a radio base station in accordance with an exemplary embodiment of the present invention.

Referring to FIG. 6 there is illustrated a block diagram of an exemplary radio base station 600 comprising a RF device 200 (e.g. as depicted in FIG. 2) comprising an active device 210, a matching network 220 and a HCC 221 in accordance with anyone of the previously described exemplary embodiments of the present invention. As previously mentioned, the active device 210 may comprise more than one input terminal. The RF device 200 is shown here as connected to an antenna 610. The RF device 200 may further be part of a transceiver (not shown). Several RF devices and transceivers and antennas may also be used. The RF device 200 can represent a power amplifier or a mixer. The RF device 200 may also represent a combination of a power amplifier and a mixer. Some components of the radio base station 600 are also shown. As illustrated, radio base station 600 may include at least a processing system 630, and at least one interface 640. Antenna 610 may include one or more directional and/or omni-directional antennas. The radio base station 600 may further include transceiver circuitry for transmitting and/or receiving symbol sequences in a network via antennas 610. Processing system 630 may control the operation of the radio base station 600. As illustrated, processing system 630 may include processing logic 632 and a memory 634. It will be appreciated that processing system 630 may include additional and/or different components than illustrated in FIG. 6. Processing logic 632 may include a processor, microprocessor, an ASIC, FPGA, or the like. Processing logic 632 may process information received via RF device 200 and interface 640. Although FIG. 6 shows exemplary components of radio base station 600, in other implementations, radio base station 600 may contain fewer, different, or additional components than depicted in FIG. 6. It should be noted that the radio base station 600 can be implemented in any suitable wireless or cellular or radio or satellite telecommunications system.

While the invention has been described in terms of several preferred embodiments, it is contemplated that alternatives, modifications, permutations and equivalents thereof are considered within the scope of the present invention. It is therefore intended that the following appended claims include such alternatives, modifications, permutations and equivalents as fall within the scope of the present invention.

The invention claimed is:

1. A harmonic control apparatus of a radio frequency device comprising an active device including at least one input terminal and an output terminal, the harmonic control apparatus comprising:
a conducting pattern in a first conducting layer, being disposed on a first side of a planar dielectric substrate, facing a second conducting layer on an opposite side of the planar dielectric substrate, the second conducting layer acting as a ground plane; and
a complementary open-loop resonator integrated in the conducting pattern to produce a shunt resonator that is configured to act as a short-circuit termination on at least one tuned frequency,
wherein the conducting pattern is formed on a semiconductor substrate on which the active device is integrated;
wherein the complementary open-loop resonator comprises two concentric rings, the resonator being modeled by an equivalent electric circuit comprising two series transmission lines, a resistance, an inductance and a capacitance that are configured to determine at least one tuned harmonic frequency; and
wherein the concentric rings are physically connected to each other.

2. The harmonic control apparatus of claim 1, wherein the conducting pattern with the integrated complementary open-loop resonator is part of a matching network.

3. The harmonic control apparatus of claim 1, wherein the complementary open-loop resonator corresponds to a complementary split ring resonator (CSRR) that is configured to be tuned to a harmonic frequency of a frequency-band of operation of the active device.

4. The harmonic control apparatus of claim 3, wherein a position of the CSRR in the conducting pattern is configured to be offset a predetermined electrical length from at least one of the at least one input terminal and the output terminal of the active device to control a reflection phase of the harmonic short-circuit termination.

5. The harmonic control apparatus of claim 1 further comprising an additional complementary open-loop resonator integrated in the conducting pattern thereby realizing a further shunt resonator acting as a short-circuit termination on at least one additional tuned frequency.

6. The harmonic control apparatus of claim 1 further comprising cascaded stages of complementary split ring resonators for independently controlling a plurality of harmonic frequencies.

7. The harmonic control apparatus of claim 1, wherein the conducting pattern is formed on a printed circuit board (PCB).

8. The harmonic control apparatus of claim 1, wherein the at least one complementary open-loop resonator is provided on at least one series transmission line of the conducting pattern or on at least one shunt stub of the conducting pattern.

9. A radio frequency device comprising:
an active device having at least one input terminal and an output terminal; and
a harmonic control apparatus, the harmonic control apparatus comprising:
a conducting pattern in a first conducting layer, being disposed on a first side of a planar dielectric substrate, facing a second conducting layer on an opposite side of the planar dielectric substrate, the second conducting layer acting as a ground plane; and
a complementary open-loop resonator integrated in the conducting pattern to produce a shunt resonator that is configured to act as a short-circuit termination on at least one tuned frequency,
wherein the conducting pattern is on a semiconductor substrate on which the active device is integrated;
wherein the complementary open-loop resonator comprises two concentric rings, the resonator being modeled by an equivalent electric circuit comprising two series transmission lines, a resistance, an inductance and a capacitance that are configured to determine at least one tuned harmonic frequency; and
wherein the concentric rings are physically connected to each other.

10. The radio frequency device of claim 9, wherein the radio frequency device is a power amplifier.

11. The radio frequency device of claim 9, wherein the radio frequency device is a mixer.

12. A radio base station comprising:
a radio frequency device, the radio frequency device comprising:
an active device having at least one input terminal and an output terminal; and
a harmonic control apparatus, the harmonic control apparatus comprising:
a conducting pattern in a first conducting layer, being disposed on a first side of a planar dielectric substrate, facing a second conducting layer on an opposite side of the planar dielectric substrate, the second conducting layer acting as a ground plane; and
a complementary open-loop resonator integrated in the conducting pattern to produce a shunt resonator that is configured to act as a short-circuit termination on at least one tuned frequency,
wherein the conducting pattern is formed on a semiconductor substrate on which the active device is integrated;
wherein the complementary open-loop resonator comprises two concentric rings, the resonator being modeled by an equivalent electric circuit comprising two series transmission lines, a resistance, an inductance and a capacitance that are configured to determine at least one tuned harmonic frequency; and
wherein the concentric rings are physically connected to each other.

* * * * *